(12) United States Patent
Huang et al.

(10) Patent No.: US 7,115,491 B2
(45) Date of Patent: Oct. 3, 2006

(54) METHOD FOR FORMING SELF-ALIGNED CONTACT IN SEMICONDUCTOR DEVICE

(75) Inventors: Tse-Yao Huang, Taipei (TW);
Kuo-Chien Wu, Miaoli (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 34 days.

(21) Appl. No.: 10/940,707

(22) Filed: Sep. 15, 2004

(65) Prior Publication Data

US 2005/0277258 A1    Dec. 15, 2005

(30) Foreign Application Priority Data

Jun. 1, 2004    (TW) .............................. 93115632 A

(51) Int. Cl.
*H01L 21/4763*    (2006.01)
(52) U.S. Cl. ...................... 438/586; 438/622; 438/634; 438/638; 438/740; 438/757
(58) Field of Classification Search ................ 438/233, 438/586, 622, 624, 634, 637, 638, 672, 740, 438/757
See application file for complete search history.

(56) References Cited

U.S. PATENT DOCUMENTS

| | | | | |
|---|---|---|---|---|
| 5,792,703 A | * | 8/1998 | Bronner et al. ............. | 438/620 |
| 5,811,357 A | * | 9/1998 | Armacost et al. ............ | 438/723 |
| 5,893,734 A | * | 4/1999 | Jeng et al. ................... | 438/239 |
| 5,930,616 A | * | 7/1999 | Dennison .................... | 438/232 |
| 5,985,711 A | * | 11/1999 | Lim ............................ | 438/229 |
| 6,083,827 A | * | 7/2000 | Lin et al. .................... | 438/631 |
| 6,159,844 A | * | 12/2000 | Bothra ........................ | 438/637 |
| 6,268,252 B1 | * | 7/2001 | Lee et al. .................... | 438/299 |
| 6,300,178 B1 | * | 10/2001 | Sunouchi .................... | 438/199 |

* cited by examiner

*Primary Examiner*—Mary Wilczewski
*Assistant Examiner*—Toniae M. Thomas
(74) *Attorney, Agent, or Firm*—Michael Bednarek; Pillsbury Winthrop Shaw Pittman LLP

(57) ABSTRACT

A method for forming a self-aligned contact on a semiconductor substrate provided with a plurality of field-effect transistors. The method comprises the steps of: forming a thin nitride insulating layer on a gate structure and a diffusion region of the transistor; forming a first insulating layer, which is then planarized to expose the nitride insulating layer on the gate structure; etching through the first insulating layer to form a first part of a contact hole; forming a first part of a contact in said first part of the contact hole; forming a second insulating layer; etching through the second insulating layer to form a second part of the contact hole; and forming a second part of the contact in the second part of the contact hole. The two-stage etching process for forming a conductive contact effectively prevents over-etching and short-circuiting between a wordline and a bitline.

16 Claims, 9 Drawing Sheets

METHOD FOR FORMING SELF-ALIGNED CONTACT IN SEMICONDUCTOR DEVICE

BACKGROUND OF THE INVENTION

1. Field of the Invention

The present invention relates to a method of fabricating a semiconductor device, and particularly to a method of fabricating a memory array by using a self-aligned contact (SAC) technique.

2. Description of the Related Art

In the fabrication of a semiconductor device, an exemplary application of the self-aligned contact (SAC) technique is to form a contact between a pair of adjacent wordlines (gate structures of field-effect transistors) in a memory array so as to electrically connect a source/drain region (junction region or diffusion region) of the transistor to a bitline.

A typical method for forming a self-aligned contact according to the prior art will be explained with reference to FIGS. 9(a) and 9(b).

First, as shown in FIG. 9(a), gate structures 101 for transistors are provided on a silicon substrate 100, and a diffusion region (junction region) 110 is formed in the substrate by using an ion implantation technique. Typically, each of the gate structures 101 includes a polysilicon layer 106 and a tungsten silicide layer 104 atop the polysilicon layer 106. Further, a cap layer 102 is formed to cap the tungsten silicide layer 104, and two spacers 108 are respectively provided along both side walls of the stack structure formed by the layers 102, 104 and 106. The cap layer 102 and the spacers 108 are all made of silicon nitride, which not only prevents the gate from being etched but also acts as an insulator between the gate and a contact.

Next, a thick oxide insulative material, for example, borophosphosilicate glass (BPSG), is filled in the memory array region, forming an oxide layer (insulating layer) 112.

Then, as shown in FIG. 9(b), a photoresist layer is coated on the surface of the oxide layer 112 to provide a mask 114 defined with a predetermined pattern exposing the region where the contact is to be formed. Later, the oxide layer 112 is etched through to the junction region 110 in the substrate 100 to form a contact hole 116 by using an etch process highly selective for the oxide relative to the nitride, i.e., an etch process in which an oxide etch rate is much greater than a nitride etch rate.

Finally, a metallic contact material is filled into the contact hole 116 to form a contact for an electric connection between the junction region and a bitline.

Although the cap layer 102 and the spacers 108 will be exposed to the enchant during the formation of the contact hole 116, it is etched very slowly since the SAC oxide etch is highly selective to nitride. Therefore, the SAC technique is advantageous in that it allows the dimension of the contact hole to be wider than the width between two adjacent gate structures and that it allows the mask 114 for exposing the contact hole to be less precisely aligned.

However, over-etching problem occurs very easily in the above SAC technology. Specifically, during the formation of the contact hole, the corner portion of the nitride (cap layer 102 and spacer 108), which has a geometric shape apt to be etched, is exposed to the etchant for a long time since the oxide layer to be etched through has a relative large depth, and it is therefore difficult to prevent over-etching of the nitride even though the oxide etch rate is much greater than the nitride etch rate. This causes exposure of the gate to the contact, leading to short-circuiting between the wordline and the bitline.

SUMMARY OF THE INVENTION

It is an object of the invention to provide a method for forming a self-aligned contact in a semiconductor device, which is adapted for use in fabrication of memory arrays to eliminate the possibility of over-etching of a nitride cap layer and spacers to thereby prevent short-circuiting between a wordline and a bitline.

A further object of the invention is to provide a method for forming a self-aligned contact in a semiconductor device, which is adapted for use in fabrication of memory arrays to form a bitline contact (CB) in a memory array area and a support contact (CS) and a gate contact (CG) in a periphery area in the same process.

To achieve the above objects, a method for forming a self-aligned contact in a semiconductor device according to the present invention comprises the steps of: depositing a thin nitride insulating layer on a substrate provided with a plurality of gate structures and diffusion regions; depositing a first insulating layer of BPSG and planarizing the first insulating layer by using CMP to expose the nitride insulating layer; forming a first part of a contact hole by etching through the first insulating layer to expose the diffusion region; forming a first part of a contact by filling a conductive material into the first part of the contact hole; depositing a second insulating layer of TEOS; forming a second part of the contact hole by etching through the second insulating layer to expose the first part of the contact; and forming a second part of the contact by filling a conductive material into the second part of the contact hole.

According to the invention, a two-stage etching process is employed to form a conductive contact in a semiconductor device. That is, the first part of the contact and the second part of the contact are jointed together to form one single contact. In the first stage, the depth of the first insulating layer (BPSG) is controlled to be a distance from the substrate to the nitride layer on the gate structure, so that the time required for etching the first insulating layer is shortened. Therefore, the over-etching problem is unlikely to occur and thus short-circuiting between a wordline and a bitline can be prevented. In the second stage, the depth of the second insulating layer (TEOS) is controlled to decide the total depth of the conductive contact.

In addition, according to the method of the present invention, bitline contacts (CB) in a memory array area, support contacts (CS) for driving circuits in a periphery area and gate contacts (CG) can be formed simultaneously in the same process.

BRIEF DESCRIPTION OF THE DRAWINGS

Objects and advantages of the present invention will be fully understood from the detailed description to follow taken in conjunction with the example as illustrated in the accompanying drawings, wherein.

DETAILED DESCRIPTION OF THE PREFERRED EMBODIMENT

The method for forming a self-aligned contact in a semiconductor device according to the present invention will be explained with reference to the cross-sectional views in FIGS. 1–8.

According to a preferred example of the present invention, bitline contacts (CB) in a memory array area, support contacts (CS) for driving circuits in a periphery area and gate contacts (CG) can be formed simultaneously in the same process.

Figure 1:
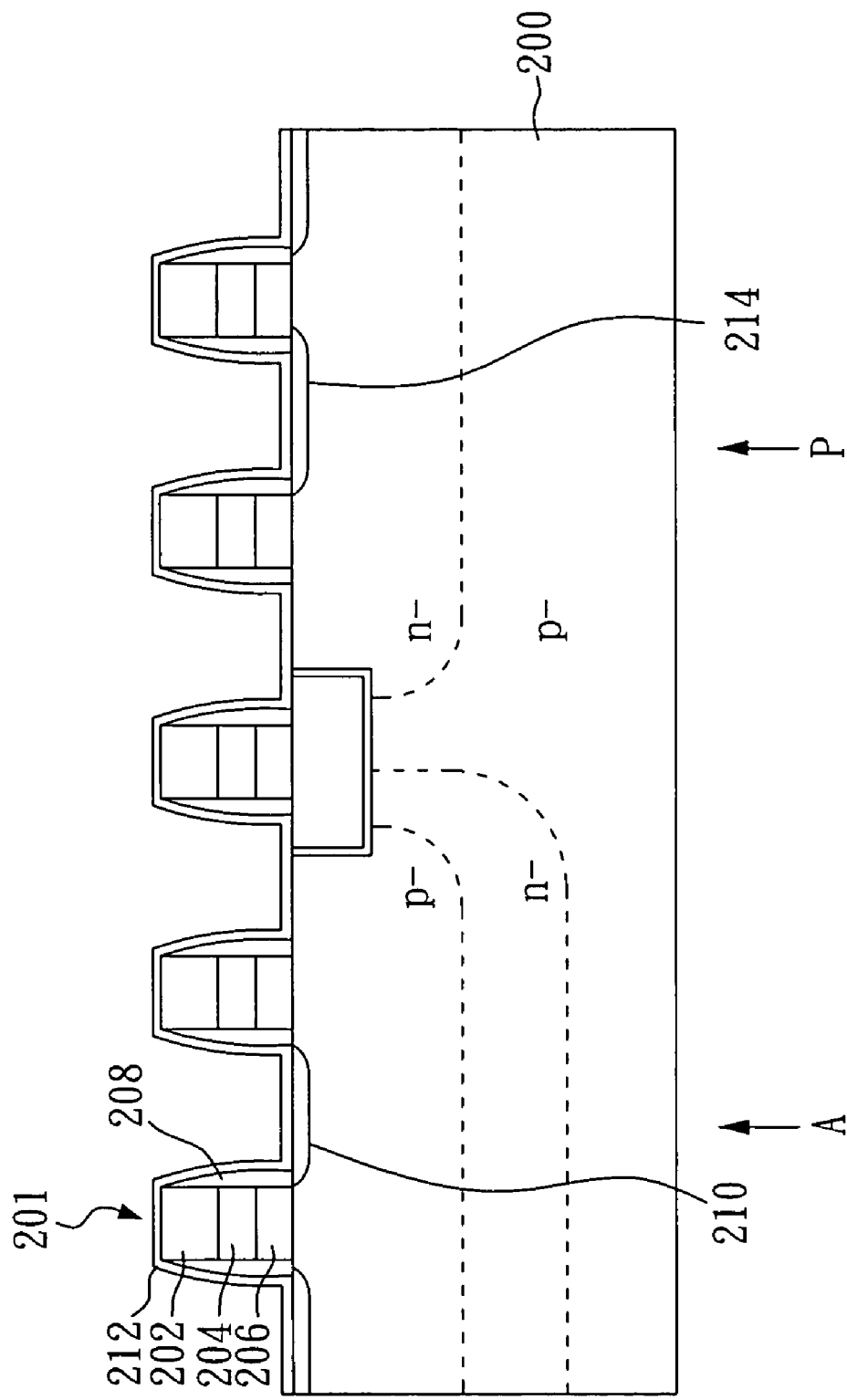
FIGS. 1 to 8 are cross-sectional views for explaining the process of the self-aligned contact technique according to the present invention.

In FIG. 1, the memory array area is on the left side, designated by an arrow A, while the periphery area is on the right side, designated by an arrow P.

Figure 9A:
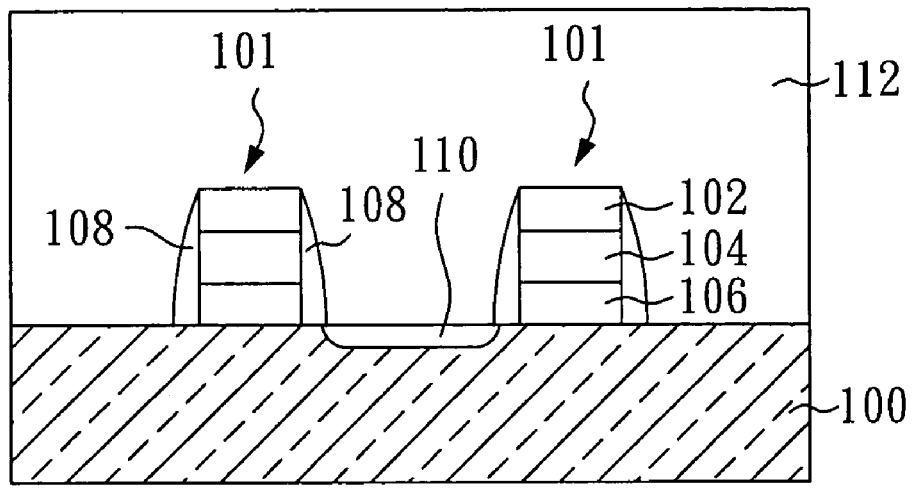
FIGS. 9(a) and 9(b) are cross-sectional views for explaining the process of the self-aligned contact technique according to the prior art.
Figure 9B:
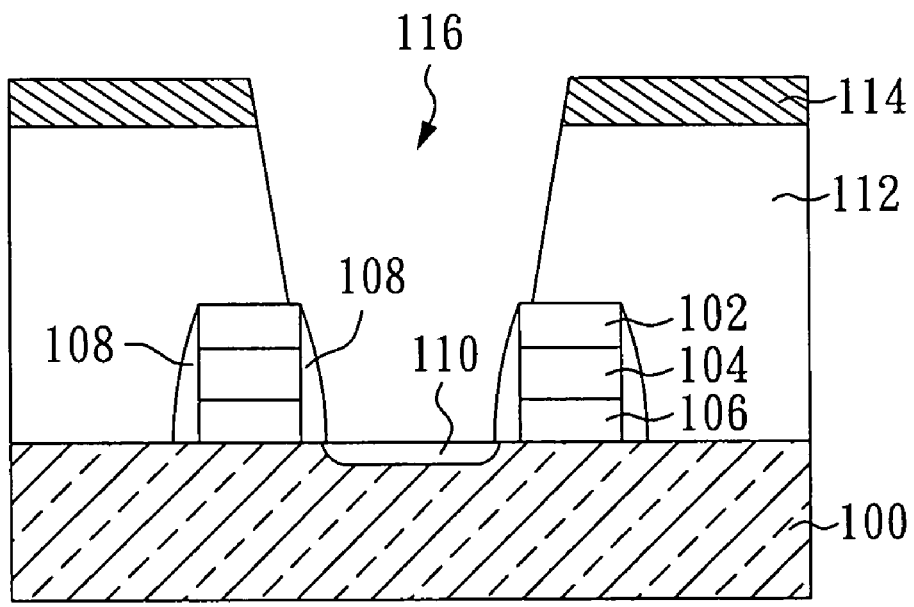

According to the preferred example of the present invention, first, a plurality of gate structures 201 are provided on a silicon substrate 200, and n+ and p+ diffusion regions (junction regions) 210 and 214 are formed in the substrate 200 by ion implantation. Similar to the prior art disclosed in FIGS. 9(a) and 9(b), each of the gate structures 201 includes a polysilicon (poly-Si) layer 206 and a tungsten silicide (WSix) layer 204 on the polysilicon layer 206. The tungsten silicide layer 204 is further capped with a silicon nitride (SiN) cap layer 202, and two silicon nitride (SiN) spacers 208 are respectively provided along the side walls of the stack structure formed by the three layers 202, 204 and 206.

Then, a thin silicon nitride (SiN) insulating layer is deposited on the entire wafer, forming a nitride insulating layer 212.

Figure 2:
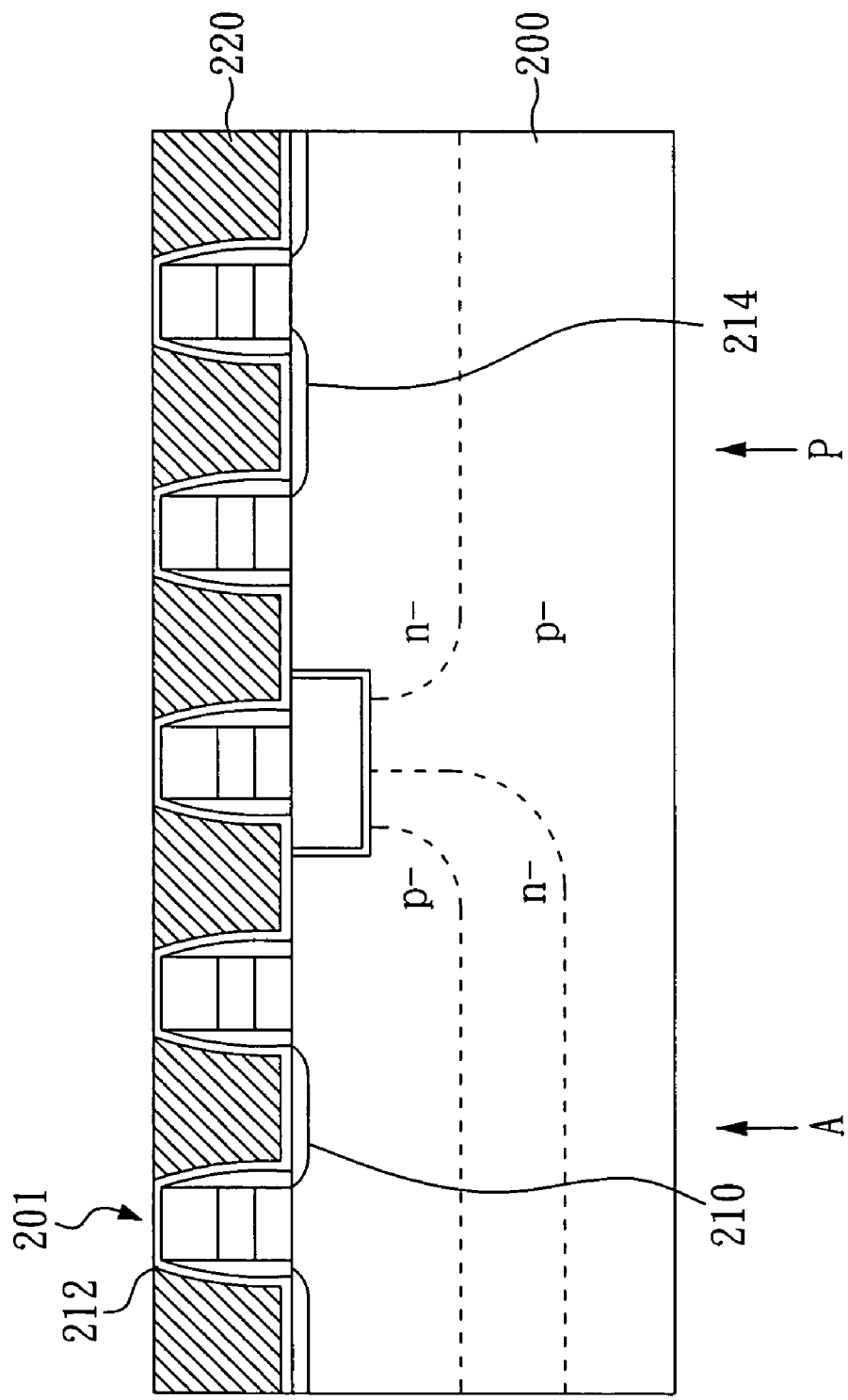

Next, referring to FIG. 2, a borophosphosilicate glass (BPSG) layer having a thickness sufficient to cover all the gate structures 201 and the nitride layer 212 is deposited on the entire wafer, forming a first insulating layer 220. Then, a top portion of the upper surface of the first insulating layer 220 is removed by using a chemical mechanical planarization (CMP) process to expose the nitride insulating layer 212. That is, the upper surface of the first insulating layer 220 is aligned with the upper surface of the nitride insulating layer 212 on the gate structures 201, as shown in FIG. 2.

Figure 3:
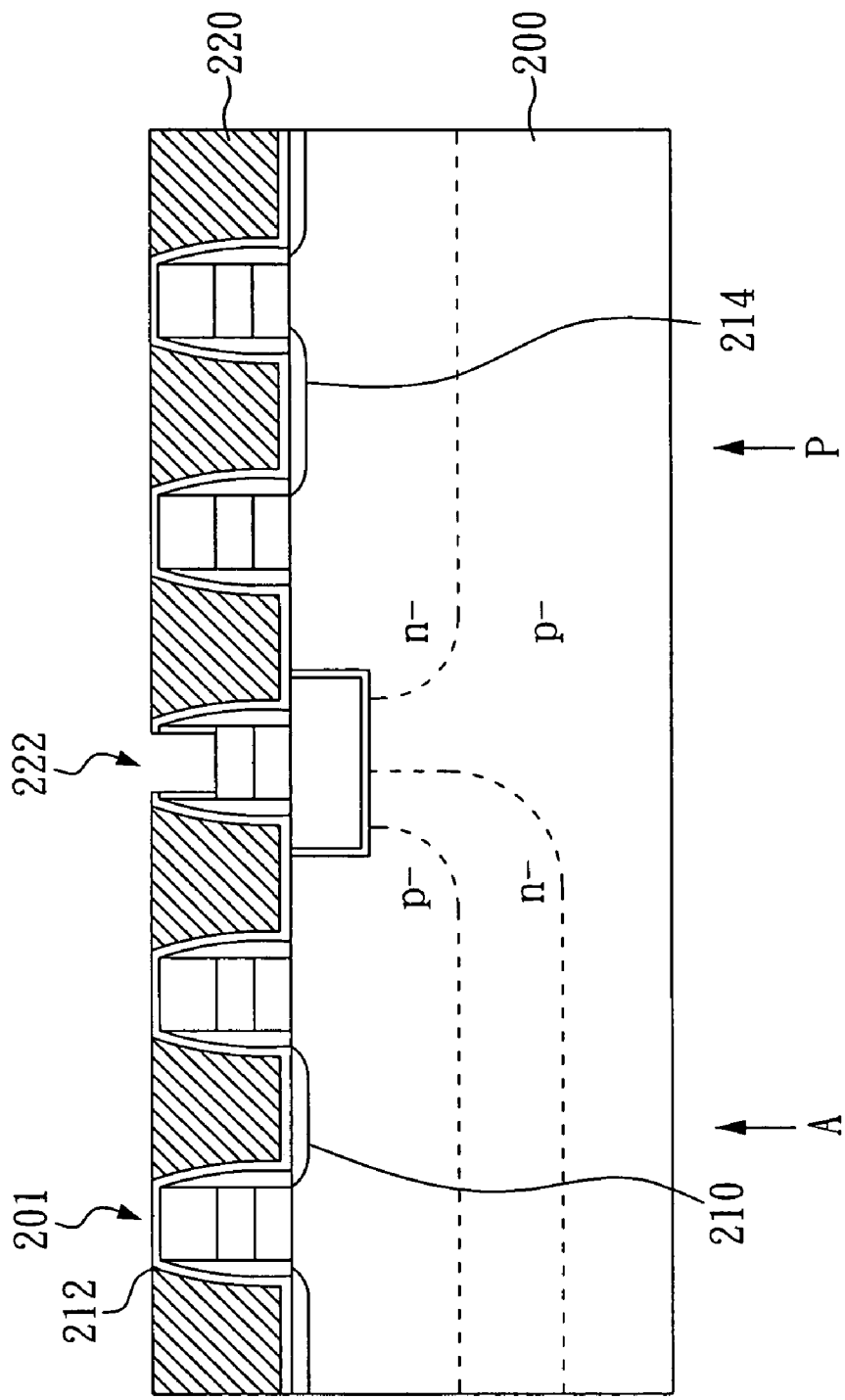

Then, referring to FIG. 3, a photoresist layer (not shown) is coated on the entire wafer to provide a mask having a predetermined pattern exposing only the region where a gate contact (CG) is to be formed. Subsequently, the nitride insulating layer 212 and the cap layer 202 not covered by the mask are etched away to expose the tungsten silicide layer 204 in the gate structure, forming a first part of a gate contact hole 222, as shown in FIG. 3.

Figure 4:
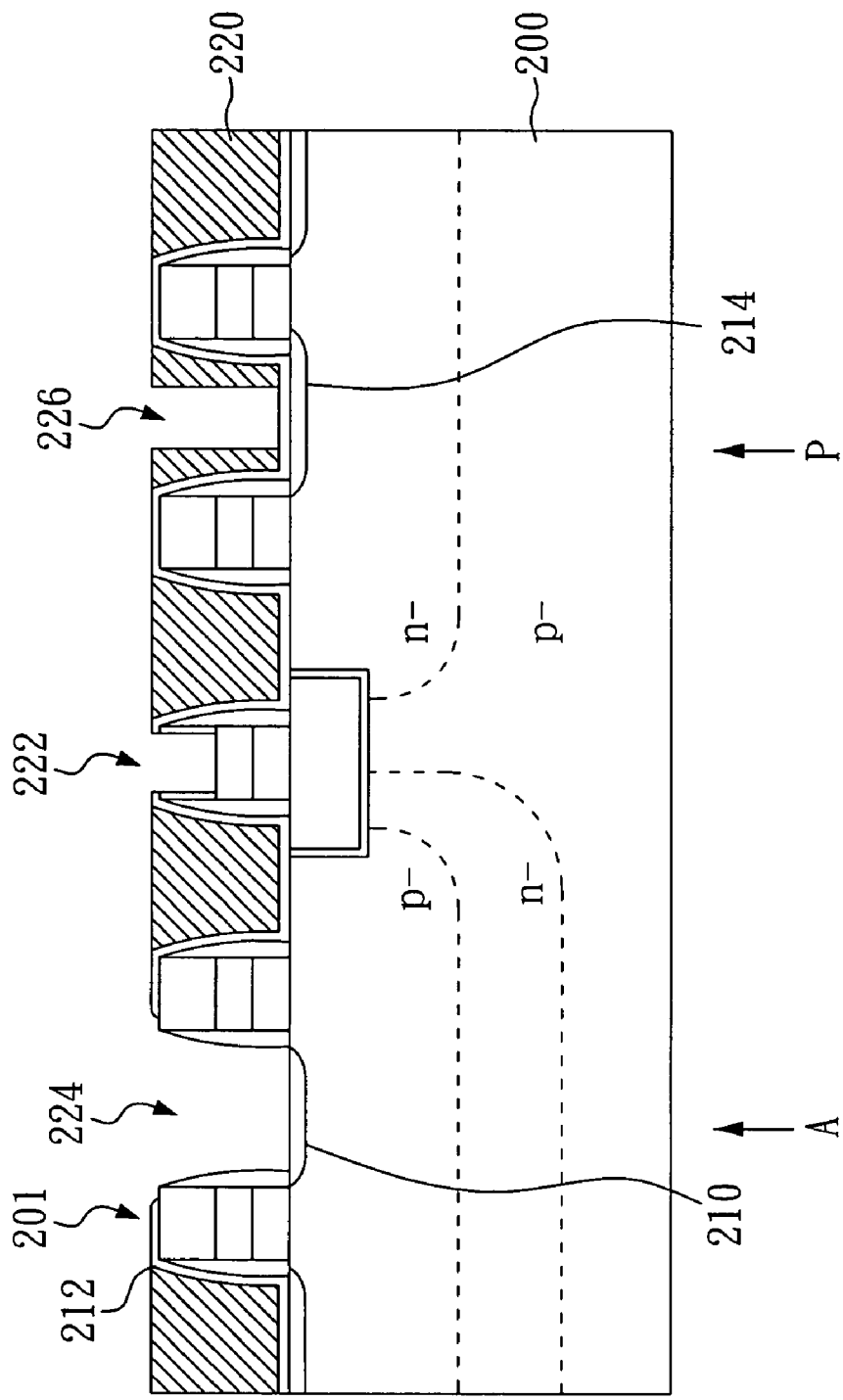

Then, Referring to FIG. 4, another photoresist layer (not shown) is coated on the entire wafer to provide a mask having a predetermined pattern exposing only the regions where a bitline contact (CB) and a support contact (CS) are to be formed. Subsequently, the first insulating layer 220 not covered by the mask is etched away to expose the diffusion regions 210 and 214 in the substrate 200, forming a first part of a bitline contact hole 224 and a first part of a support contact hole 226, as shown in FIG. 4. A selective etching technique, in which an oxide etch rate is much higher than a nitride etch rate, preferably wet etching, is employed in this step. As compared to the prior art, the etching distance of the first insulating layer (BPSG) 220 is reduced in the invention, and thus the etching time is shortened. Therefore, loss of the nitride at the corner portion (cap layer 202 and spacer 208) can be suppressed. In other words, it is possible to prevent over-etching of the nitride and short-circuiting between the wordline and the bitline.

Figure 5:
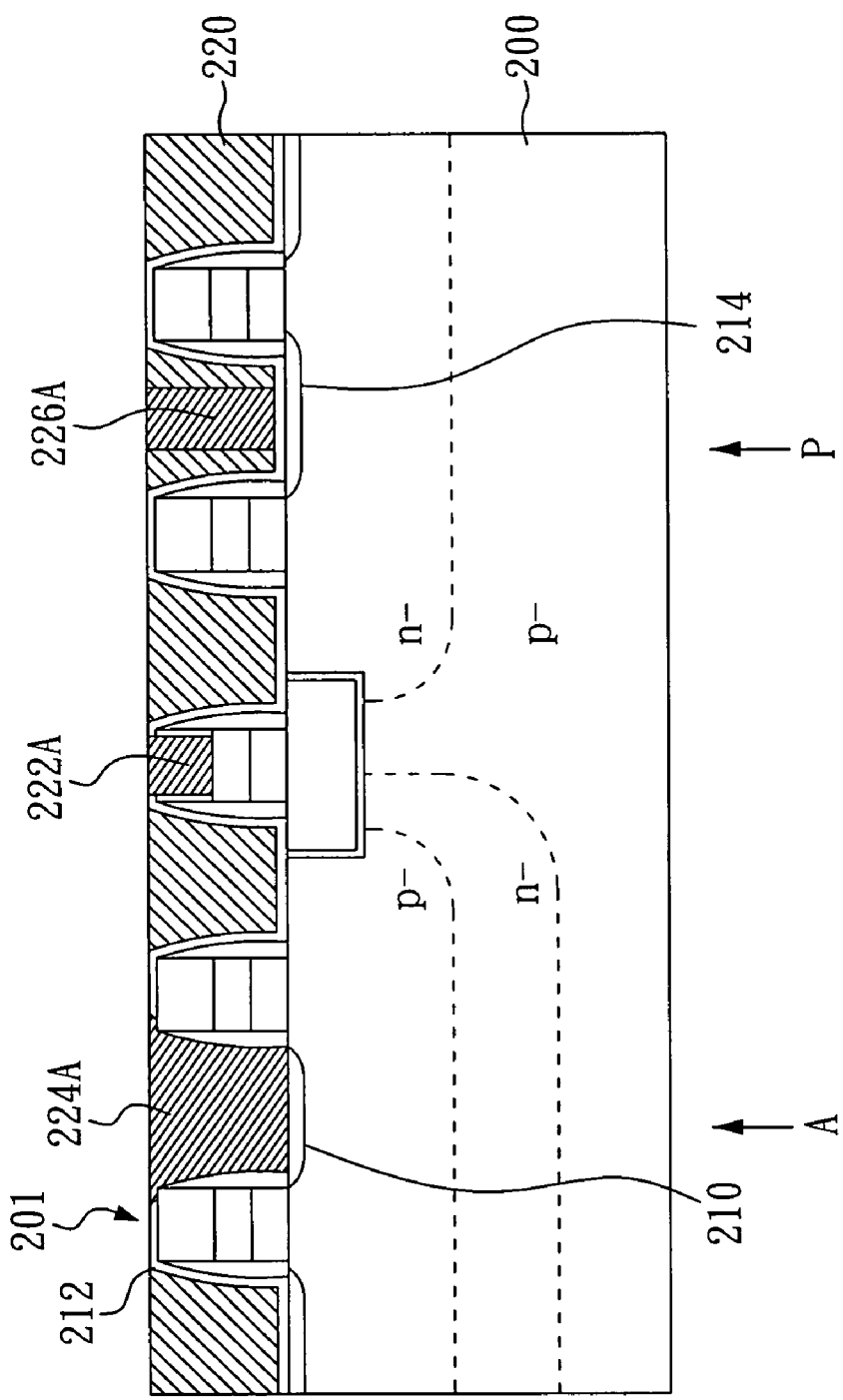

Then, referring to FIG. 5, a conductive material is simultaneously filled into the first part of the gate contact hole 222, the first part of the bitline contact hole 224 and the first part of the support contact hole 226 and planarized with a CMP process, respectively forming a first part of agate contact 222A, a first part of a bitline contact 224A and a first part of a support contact 226A. The method of filling a conductive material into a contact hole is known in the art and may include deposition of titanium (Ti), formation of titanium nitride (TiN) and deposition of tungsten (W) to form a conventional W/TiN/Ti contact structure.

Figure 6:
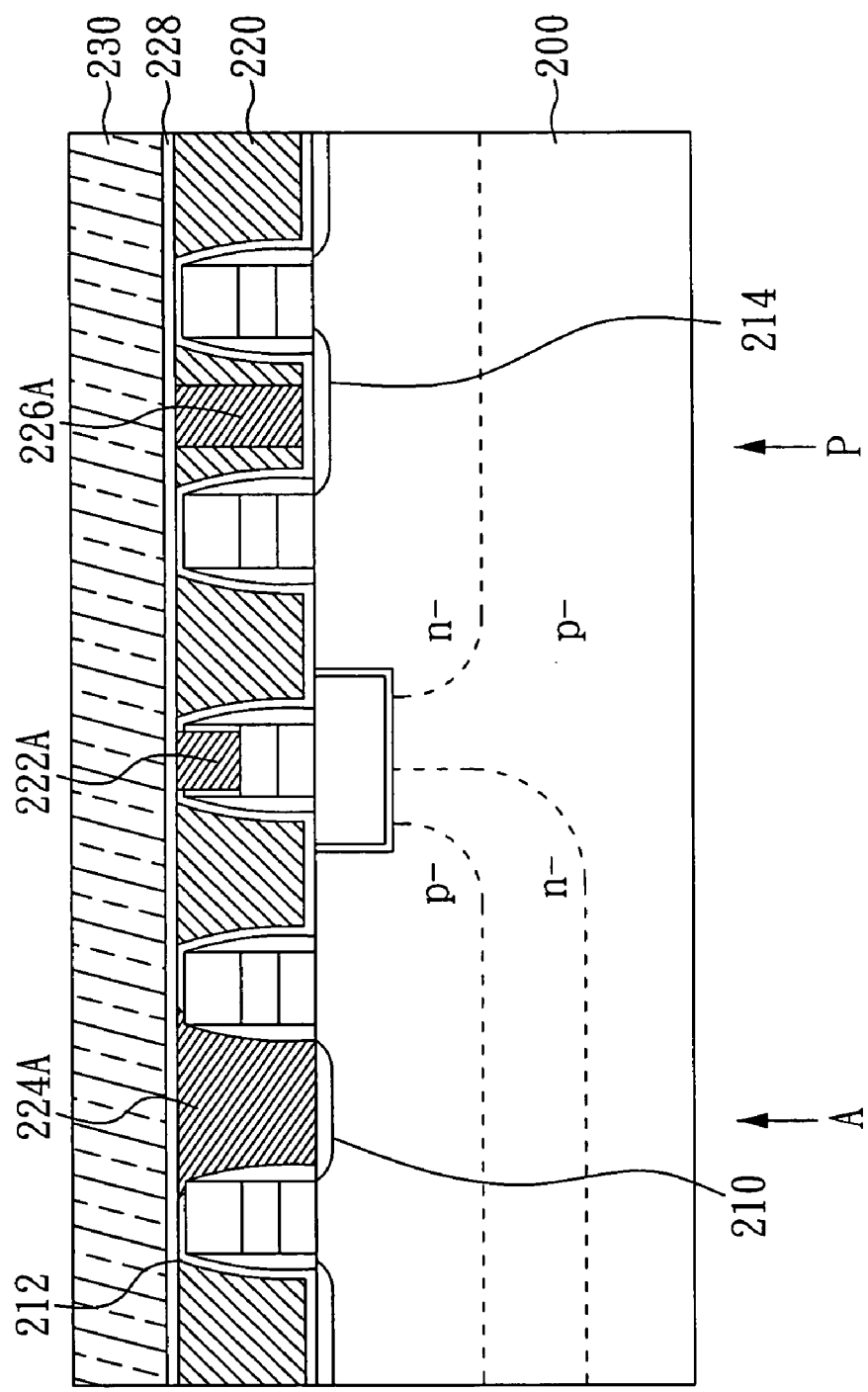

Then, referring to FIG. 6, a thin a silicon nitride (SiN) insulating layer is deposited on the entire wafer, forming a nitride insulating layer 228. Subsequently, a tetraethoxysilane (TEOS) layer having a thickness of about 1500 Å is deposited on the nitride insulating layer 228, forming a second insulating layer 230.

Figure 7:
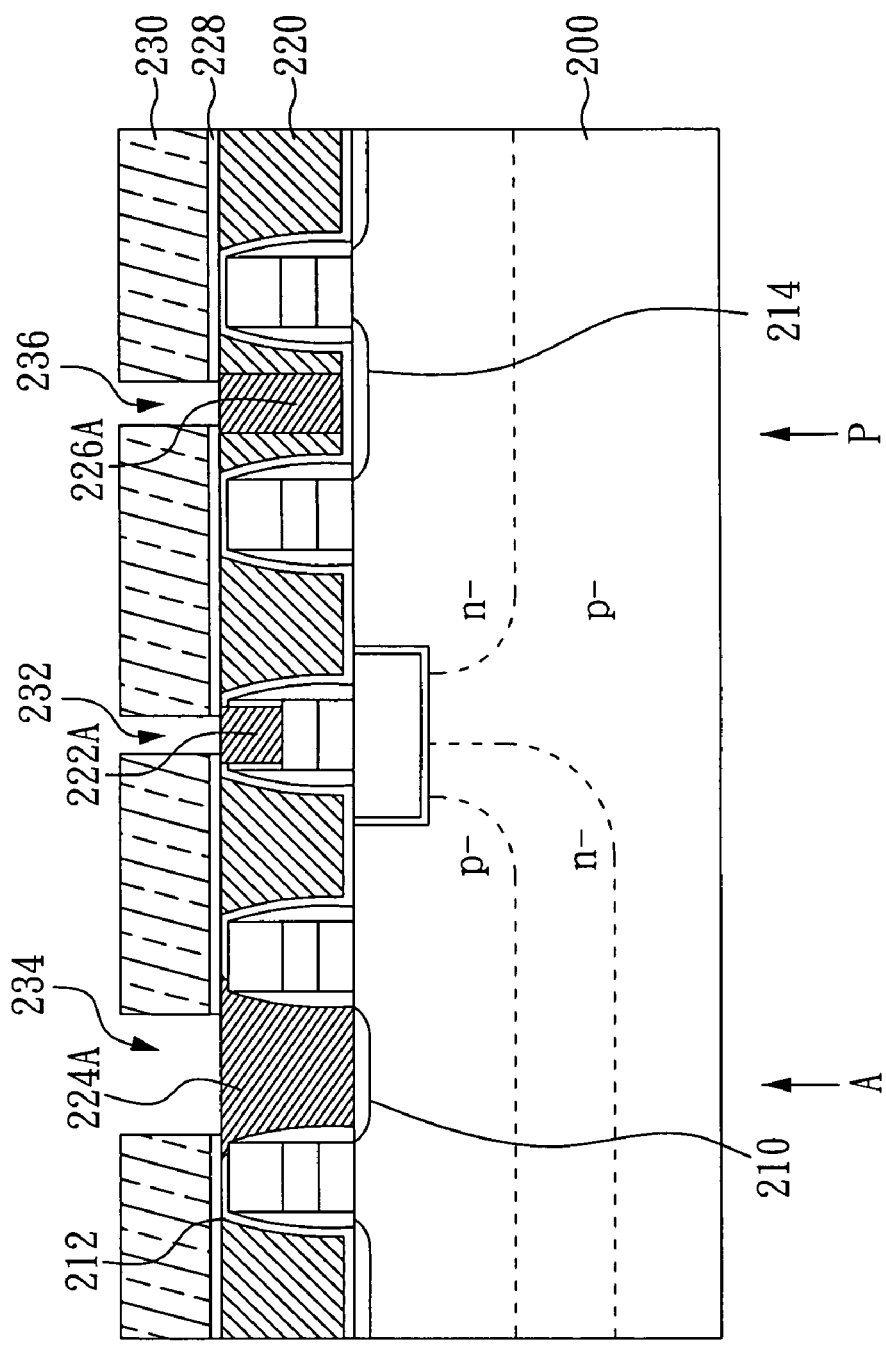

Then, referring to FIG. 7, another photoresist layer (not shown) is coated on the entire wafer to provide a mask having a predetermined pattern exposing only the regions where the gate contact (CG), the bitline contact (CB) and the support contact (CS) are to be formed. Subsequently, the second insulating layer 230 and the nitride insulating layer 228 not covered by the mask are etched away to expose the first part of the gate contact 222A, the first part of the bitline contact 224A and the first part of the support contact 226A, respectively forming a second part of the gate contact hole 232, a second part of the bitline contact hole 234 and a second part of the support contact hole 236, as shown in FIG. 7.

Figure 8:
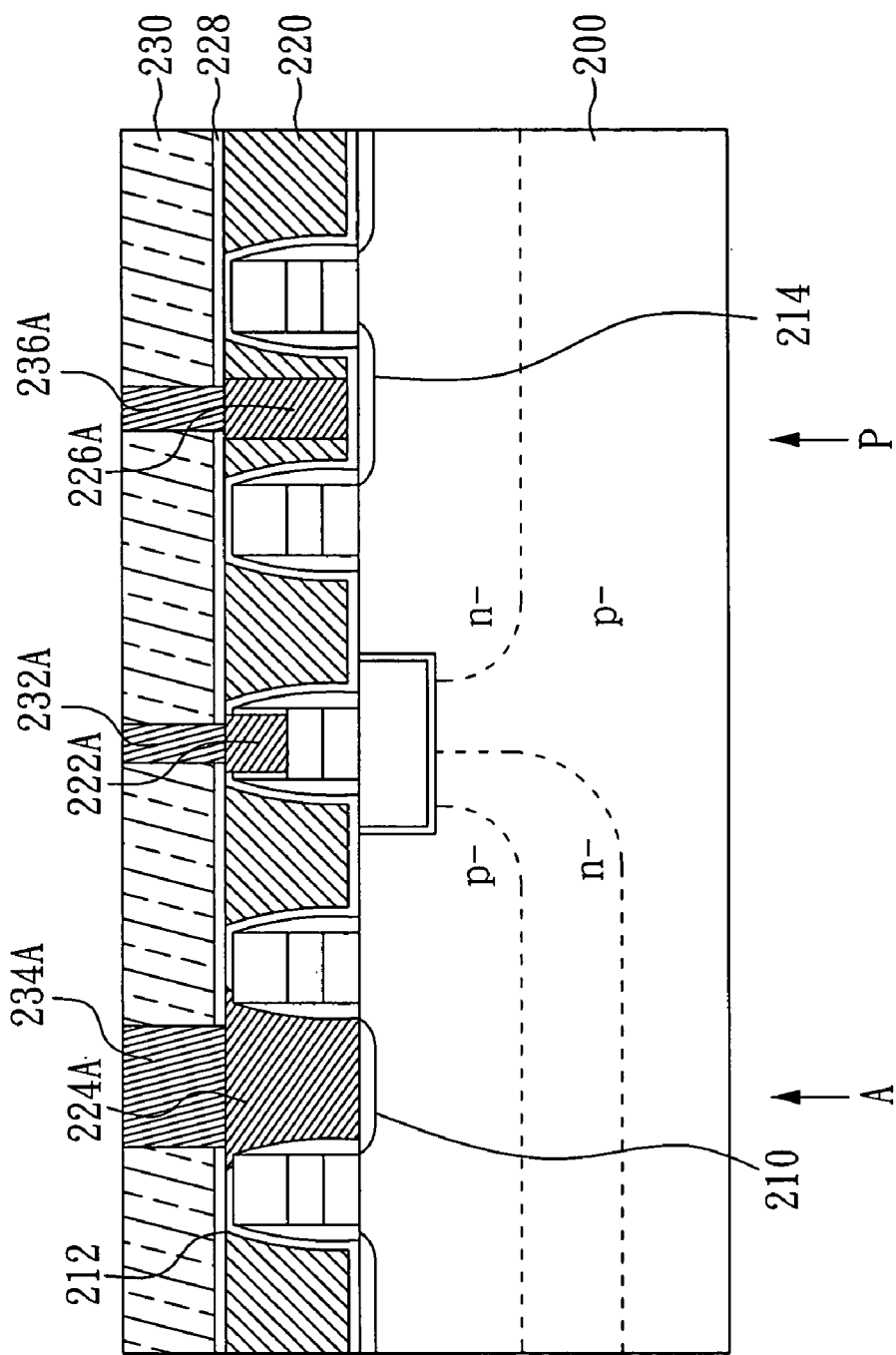

Finally, referring to FIG. 8, a conductive material is simultaneously filled into the second part of the gate contact hole 232, the second part of the bitline contact hole 234 and the second part of the support contact hole 236 and planarized to form a second part of the gate contact 232A, a second part of the bitline contact 234A and a second part of the support contact 236A, respectively. The method of filling a conductive material into a contact hole is known in the art and may include deposition of titanium (Ti), formation of titanium nitride (TiN) and deposition of tungsten (W) to form a conventional W/TiN/Ti contact structure.

As shown in FIG. 8, conductive contacts are formed in a semiconductor device by using the inventive two-stage etching process according to the method for forming a self-aligned contact of the present invention. That is, the first part of the gate contact 222A and the second part of the gate contact 232A are jointed together to provide a single gate contact (CG). Similarly, the first part of the bitline contact 224A and the second part of the bitline contact 234A are jointed together to provide a single bitline contact (CB) and the first part of the support contact 226A and the second part of the support contact 236A are jointed together to provide a single support contact (CS).

According to the two-stage method for forming a self-aligned contact of the present invention, the depth of the first insulating layer (BPSG) 220 is controlled by CMP to be a distance from the substrate 200 to the nitride layer on the gate structure 201 in the first stage, so that the etching distance is reduced and thus the time required for etching the first insulating layer 220 is shortened. Therefore, the over-etching problem is unlikely to occur and thus short-circuiting between a wordline and a bitline can be prevented. In the second stage, the depth of the second insulating layer (TEOS) 230 is controlled to decide the depth of the M0 metal interconnect layer.

While the present invention has been described with reference to the preferred example thereof, it is to be understood that the invention should not be considered as limited thereby. Various modifications and changes could be conceived of by those skilled in the art without departing from the scope of the present invention, which is indicated by the appended claims.

What is claimed is:

1. A method for forming a self-aligned contact in a semiconductor device, comprising the steps of:
    (a) providing a substrate having at least one gate structure and at least one diffusion region adjacent said gate structure;
    (b) forming a thin layer along a profile of said gate structure, including an entire top portion of said gate structure, and said diffusion region;
    (c) forming a first insulating layer at least covering said gate structure and said diffusion region;
    (d) removing a portion of said first insulating layer to expose the entire portion of said thin layer atop said gate structure;
    (e) forming a first part of a contact hole through said first insulating layer and exposing at least a portion of said diffusion region;
    (f) forming a first part of a contact in said first part of said contact hole;
    (g) forming a second insulating layer at least covering said gate structure and said first part of said contact;
    (h) forming a second part of said contact hole through said second insulating layer and exposing at least a portion of said first part of said contact; and
    (i) forming a second part of said contact in said second part of said contact hole.

2. The method for forming a self-aligned contact in a semiconductor device of claim 1, wherein said thin layer is a nitride insulating layer.

3. The method for forming a self-aligned contact in a semiconductor device of claim 1, further comprising forming a thin nitride insulating layer at least covering said gate structure and said first part of said contact before said step (g).

4. The method for forming a self-aligned contact in a semiconductor device of claim 1, wherein said first insulating layer is made of borophosphosilicate glass (BPSG).

5. The method for forming a self-aligned contact in a semiconductor device of claim 1, wherein said second insulating layer is made of tetraethoxysilane (TEOS).

6. The method for forming a self-aligned contact in a semiconductor device of claim 1, wherein said step (e) is performed by wet etching.

7. The method for forming a self-aligned contact in a semiconductor device of claim 2, wherein said nitride insulating layer is made of silicon nitride (SiN).

8. The method for forming a self-aligned contact in a semiconductor device of claim 3, wherein said nitride insulating layer is made of silicon nitride (SiN).

9. A method for forming a self-aligned contact in a semiconductor device, comprising the steps of:
    (a) providing a substrate having a plurality of gate structures and diffusion regions adjacent said gate structures, each of said gate structures including a conductive layer;
    (b) forming a thin layer along a profile of said gate structures, including an entire top portion of said gate structure, has been inserted after "said gate and said diffusion regions;
    (c) forming a first insulating layer at least covering said gate structures and said diffusion regions;
    (d) removing a portion of said first insulating layer to expose the entire portion of said thin layer atop said gate structures;
    (e) forming a first part of a first type contact hole through one of said gate structures and exposing at least a portion of said conductive layer of said gate structure;
    (f) forming a first part of a second type contact hole through said first insulating layer and exposing at least a portion of said diffusion region;
    (g) simultaneously forming a first part of a first type contact and a first part of a second type contact in said first part of said first type contact hole and said first part of said second type contact hole, respectively;
    (h) forming a second insulating layer at least covering said gate structures, said first part of said first type contact and said first part of said second type contact;
    (i) simultaneously forming a second part of said first type contact hole and a second part of said second type contact hole through said second insulating layer and exposing at least a portion of said first part of said first type contact and at least a portion of said first part of said second type contact; and
    (j) simultaneously forming a second part of said first type contact and a second part of said second type contact in said second part of said first type contact hole and said second part of said second type contact hole, respectively.

10. The method for forming a self-aligned contact in a semiconductor device of claim 9, wherein said thin layer is a nitride insulating layer.

11. The method for forming a self-aligned contact in a semiconductor device of claim 9, further comprising forming a thin nitride insulating layer at least covering said gate structures, said first part of said first type contact and said first part of said second type contact before said step (h).

12. The method for forming a self-aligned contact in a semiconductor device of claim 9, wherein said first insulating layer is made of borophosphosilicate glass (BPSG).

13. The method for forming a self-aligned contact in a semiconductor device of claim 9, wherein said second insulating layer is made of tetraethoxysilane (TEOS).

14. The method for forming a self-aligned contact in a semiconductor device of claim 9, wherein said step (f) is performed by wet etching.

15. The method for forming a self-aligned contact in a semiconductor device of claim 10, wherein said nitride insulating layer is made of silicon nitride (SiN).

16. The method for forming a self-aligned contact in a semiconductor device of claim 11, wherein said nitride insulating layer is made of silicon nitride (SiN).

* * * * *